United States Patent [19]

Cowley

[11] Patent Number: 4,806,872
[45] Date of Patent: Feb. 21, 1989

[54] FREQUENCY MODULATION RECEIVER EMPLOYING FREQUENCY DIVIDER

[75] Inventor: Nicholas P. Cowley, Wroughton, England

[73] Assignee: Plessey Overseas Limited, Ilford, England

[21] Appl. No.: 868,908

[22] Filed: May 29, 1986

[51] Int. Cl.$^4$ ............................................. H04B 1/16
[52] U.S. Cl. ..................................... 329/103; 455/216; 455/314
[58] Field of Search ................. 329/103, 110; 455/214, 455/216, 312, 314, 333

[56] References Cited

U.S. PATENT DOCUMENTS 3,525,046  8/1970  Bourget ................................ 455/314

Primary Examiner—Eugene R. LaRoche
Assistant Examiner—Robert J. Pascal
Attorney, Agent, or Firm—Fleit, Jacobson, Cohn & Price

[57] ABSTRACT

A frequency dividing arrangement comprises an injection-locked divider arranged for receiving an incoming signal $F_{in}$ and for providing a frequency divided signal $F_{out}$ in response thereto, and a frequency divider coupled to the injection-locked divider. The frequency divider comprises logical circuits for providing a further frequency divided signal $F''_{out}$ in response to the frequency divided signal $F_{out}$ provided by the injection-locked divider. The arrangement may be included in a frequency modulation receiver which comprises an FM detector. The injection-locked divider comprises a multiplier, and a tuning circuit.

8 Claims, 3 Drawing Sheets

FREQUENCY MODULATION RECEIVER EMPLOYING FREQUENCY DIVIDER

TECHNICAL FIELD

This invention relates to frequency dividers, and in particular, to frequency dividers for use in frequency modulation (FM) receivers.

BACKGROUND OF THE INVENTION

It is well known that before detection of an FM signal carried by an incoming radio frequency (RF) carrier wave takes place, the RF signal is fed through a frequency translation means, for example one or more mixing circuits, so that the radio frequency (RF) signal can be translated down to an intermediate frequency (IF) signal. The IF signal is then fed to an FM detector which affords a voltage output which is proportional to the FM modulation signal carried by the carrier wave.

An alternative frequency translation means known to the applicants includes the use of a frequency divider which comprises logic circuit elements operative to frequency divide the RF signal by N, where N is an integer.

Such frequency dividers have the disadvantage that they are not well suited for use in FM detectors which are intended for fringe frequency modulation reception areas or space communication.

OBJECT OF THE INVENTION

It is the intention of the present invention to provide a frequency divider arrangement which can operate at an improved speed so as to frequency divide signals of a relatively higher frequency and, when coupled to an FM detector, can improve noise threshold of the FM detector.

SUMMARY OF THE INVENTION

According to the present invention there is provided a frequency dividing arrangement comprising an injection-locked divider arranged for receiving an incoming signal and for providing a frequency divided signal in response thereto, and a frequency divider coupled to the injection-locked divider, which frequency divider comprises logical circuits for providing a further frequency divided signal in response to the frequency divided signal provided by the injection-locked divider.

The frequency dividing arrangement may be incorporated into a frequency modulation (FM) receiver for receiving an RF radio signal and for producing a signal indicative of the information content of the modulating wave of the radio signal. In this case, the further frequency divided signal provided by the frequency divider is afforded to an FM detector.

FM receivers which incorporate frequency dividing arrangements according to the present invention are advantageous in that they can receive RF signals of a relatively higher frequency, and their noise threshold is improved. Consequently, such receivers are eminently suitable for use in satellite broadcasting where FM receivers are frequently required to operate near to the threshold at which frequency modulated signals can be detected over background noise.

The FM detector may comprise a phase sensitive detector arranged to receive the further frequency divider signal from a first path and a second path, which second path has a phase shift means located therein. The phase shift means is operative to shift the phase of the further frequency divided signal from the second path relative to the further frequency divided signal from the first path in dependence upon its frequency so as to enable the phase sensitive detector to provide an output signal corresponding to the modulation carried by the incoming signal.

The frequency divider may be operative to frequency divide the frequency divided signal provided by the injection-locked divided by two.

In this case, the frequency divider may be in the form of a D-type bistable.

Coupling the injection-locked divider to the FM detector via a frequency divider has the additional advantage that mutual coupling between resonant circuits in the injection-locked divider and the FM detector is avoided.

The injection-locked divider preferably comprises a non-linear amplifying means, and a tuning circuit comprising a direct current blocking means, an alternating current coupling means and a resonance circuit, wherein the non-linear amplifying means is arranged to provide the frequency divided signal, via the direct current blocking means, in dependence upon the incoming signal and the frequency divided signal fed to a second input of the non-linear amplifying means via the direct current blocking means and the alternating current coupling means, and the resonance circuit couples a point between the direct currect blocking means and the alternating current coupling means to ground.

The direct current blocking means and the alternating current coupling means may each comprise capacitors.

The resonance circuit may comprise an inductor connected in series with a capacitance.

The point may also be coupled to the virtual ground via a resistance means.

Such injection-locked dividers (ILD) are advantageous in that they have an improved injection-lock range, a relatively more symmetric injection range, and component values for the ILD are more easily manufactured.

The injection-locked divider may be arranged to frequency divide the incoming signal by unity by changing the frequency of the tuning circuit to match the frequency of the incoming signal. In this case, the injection-locked divider acts as an injection-locked oscillator.

BRIEF DESCRIPTION OF THE DRAWINGS

The invention will now be further described by way of example with reference to the accompanying drawings, in which:-

DETAILED DESCRIPTION OF THE INVENTION

Figure 1:
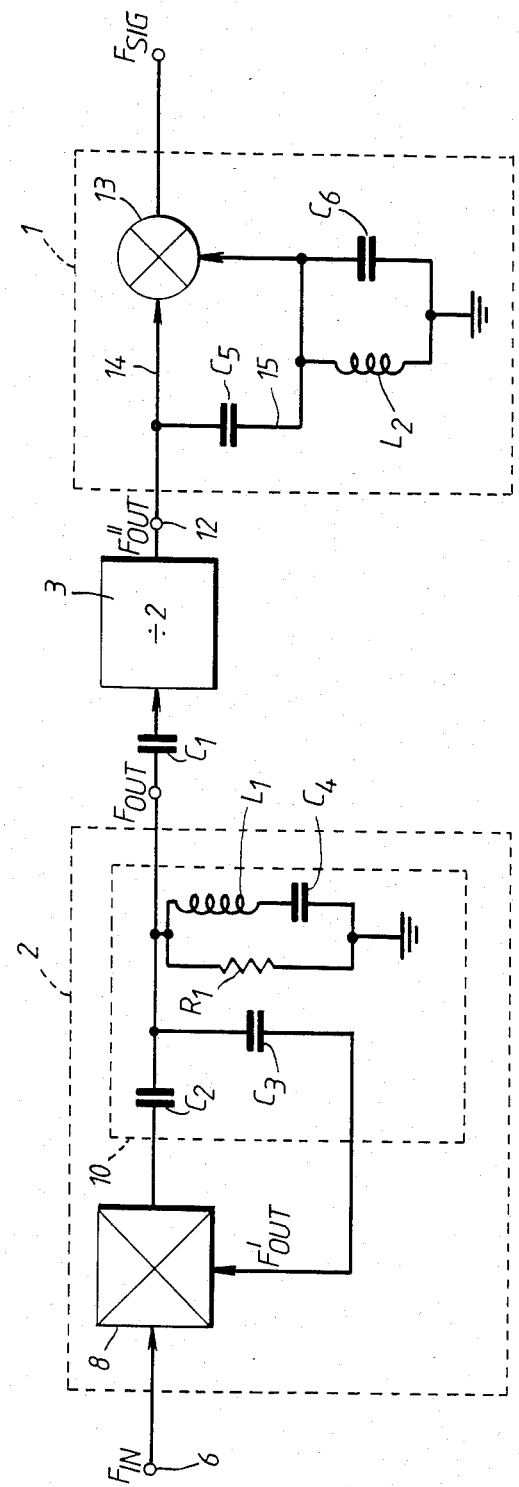
FIG. 1 is a schematic diagram of a frequency dividing arrangement embodying the present invention shown coupled to an FM detector.

Referring first of FIG. 1, there is shown an FM detector 1 which is suitable for use in an FM receiver. The FM detector 1 is preceded by a frequency dividing arrangement embodying the present invention which comprises an injection-locked frequency divider 2 coupled with a frequency divider 3. In this arrangement, the injection-locked frequency divider is connected to the frequency divider 3 via a coupling capacitor $C_1$. In FIG. 1, there is shown a terminal 6 provided for receiving a frequency modulated radio frequency (RF) signal $F_{IN}$ containing information embodied in the modulation thereof. The signal $F_{IN}$ is fed to a first input of a multiplier 8 of the injection-locked frequency divider 2 where it is multiplied with a signal $F'_{out}$ received at a second input of the multiplier 8.

The injection-locked frequency divider also comprises a tuning circuit 10 which comprises a direct current (d.c.) blocking means in the form of a capacitor $C_2$, an alternating current (a.c.) coupling means in the form of a capacitor $C_3$, and a resonant circuit which comprises a serially connected inductance $L_1$ and capacitor $C_4$ in parallel with a resistor $R_1$.

The injection-locked frequency divider is operative to frequency divide the signal $F_{IN}$ by two to provide a frequency divided signal $F_{out}$. A detailed description of the construction of the injection-locked oscillator will be given below with reference to FIG. 3.

The frequency divided signal $F_{out}$ is fed via the coupling capacitor $C_1$ to the frequency divider 3 which, in this example, is operative to frequency divide the frequency divided signal $F_{out}$ by two to provide a further frequency divided signal $F''_{out}$ at a terminal 12. The frequency divider 3 is described below in greater detail with reference to FIG. 2.

The frequency dividing arrangement frequency divides the incoming signal $F_{IN}$ by four, but may be arranged to divide by higher or lower numbers according to requirements. For example, the frequency of the tuning circuit 10 could be changed to match the frequencies of the signal $F_{IN}$ in which case the injection-locked frequency divider operates as an injection-locked oscillator with an effective division ratio of one.

The further frequency divided signal $F''_{out}$ is fed from the terminal 12 to the FM detector 1 where it is demodulated. The signal $F''_{out}$ is fed to a phase sensitive detector 13 via a first path 14, and is fed to the phase sensitive detector via a second path 15. A phase shift means is located in the second path 15 and comprises a phase quadrature device consisting of a capacitor $C_5$, and a capacitor $C_6$ connected in parallel with a coil $L_2$. The capacitor $C_6$ and the coil $L_2$ connect the second path 15 to earth thereby imposing a frequency delay on the signal $F''_{out}$ dependent upon its frequency. The capacitor $C_5$ imposes a 90° phase shift on the signal $F''_{out}$ transmitted by the second path 15. Hence, the phase sensitive detector 13 receives the further frequency divided signal $F''_{out}$ over two separate paths such that the signal $F''_{out}$ in one path varies in phase with respect of the other in dependence upon the modulation on the incoming signal $F_{IN}$. The phase sensitive detector 13 provides an output signal $F_{sig}$ which is indicative of the frequency modulation content of the incoming signal $F_{IN}$.

Figure 2:
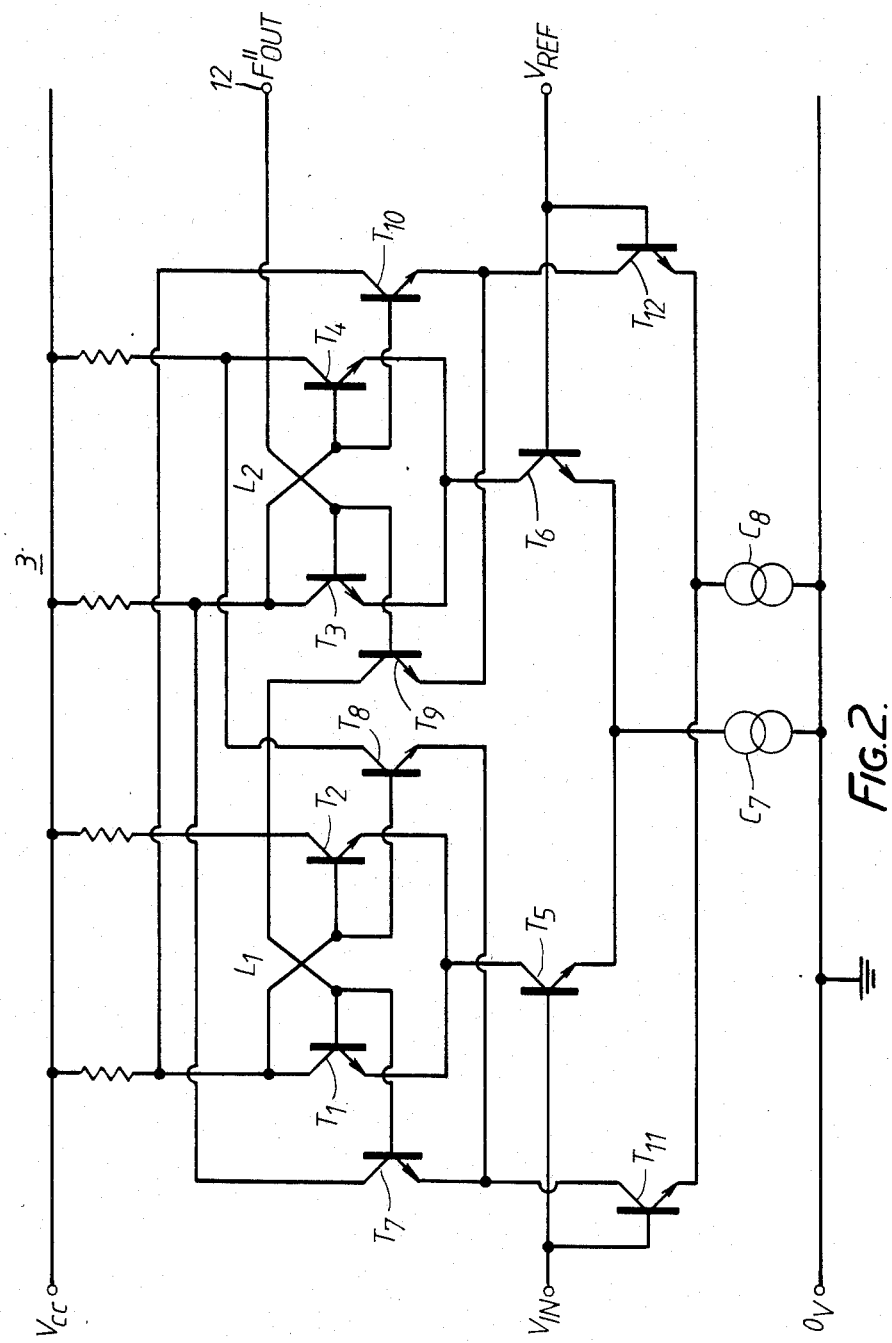
FIG. 2 is a circuit diagram of a frequency divider of the frequency dividing arrangement of FIG. 1.

Referring now to FIG. 2, there is shown a detailed example of the frequency divider 3 which comprises logic circuit elements operative to frequency divide signals by 2. The frequency divider 3 is a D-type bistable and comprises a pair of latches L1 and L2. The latch L1 comprises a pair of transistors T1 and T2 and the latch L2 comprises a pair of transistors T3 and T4. The current is supplied to the latches L1 and L2 by a long tail pair comprising a pair of transistors T5 and T6 and a current source $C_7$. The incoming frequency divided signal $F_{out}$ is fed via the terminal $V_{in}$ to the transistor T5. The base of the transistor T6 is supplied with a reference voltage $V_{ref}$.

Sensing gates T7, T8 and T9, T10 are operatively associated with the latches L1 and L2, respectively, and they are effective for sensing the state of the latch with which they are associated. This is to say, the sensing gate T7 and T8 senses the state of the latch L1 and is operative to set the state of the latch L1 into the latch L2, and the sensing gate T9 and T10 senses the state of the latch L2 (which state is the inverse of the state of the latch L1) and is operative to set the state of the latch L2 into the latch L1. Each of the sensing gates T7, T8 and T9, T10 is supplied with current from a pair of transistors T11, T12 and a current source $C_8$.

The divider 3 is operative to provide the further frequency divided signal $F''_{out}$ from the terminal 12.

Figure 3:
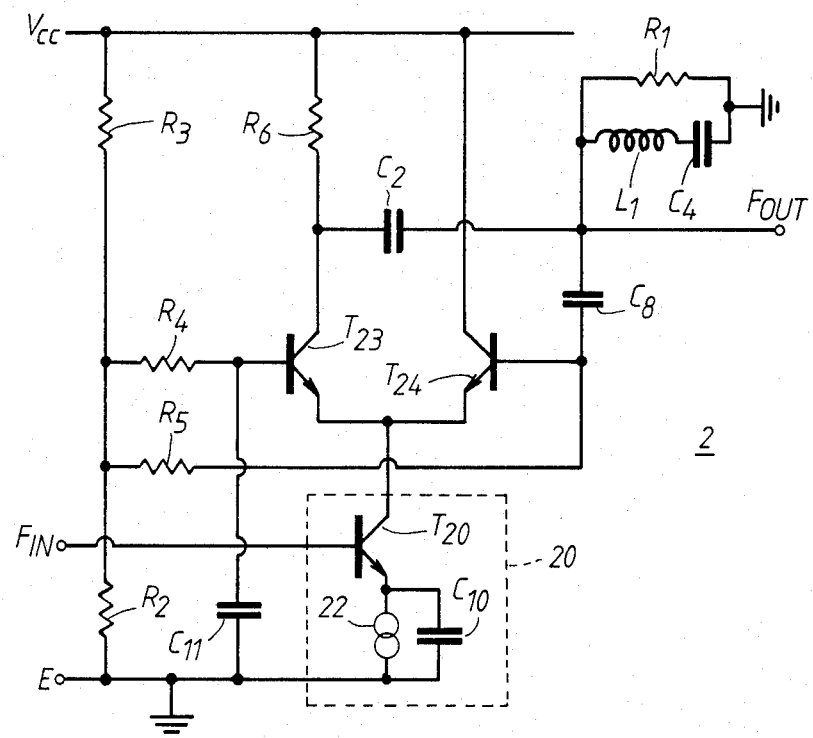
FIG. 3 is a circuit diagram of an injection-locked frequency divider of the frequency dividing arrangement of FIG. 1.

Referring now to FIG. 3, the injection-locked divider 2 will be described in detail.

The injection-locked divider comprises a current injection means 20 which comprises a transistor $T_{20}$, and a means for providing direct current which, in this case, consists of a constant current source 22 and a capacitor $C_{10}$. The base electrode of the transistor $T_{20}$ receives the incoming signal $F_{IN}$ and the current injector provides a direct current to the emitter electrodes of a non-linear amplifying means or multiplier in dependence upon the incoming signal $F_{IN}$.

The non-linear amplifying means comprises a long tail pair of transistors $T_{23}$ and $T_{24}$ connected as shown in FIG. 3.

In this example, the transistors $T_{23}$ and $T_{24}$ are biased at a voltage determined by a potential divider consisting of resistors $R_2$, $R_3$, $R_4$, $R_5$, and a capacitor $C_1$ connected between a voltage rail $V_{cc}$ and an earth rail E.

The d.c. blocking means comprising the capacitor $C_2$, through which the signal $F_{out}$ is fed, is connected to the collector electrode of the transistor 23, and the a.c. coupling means, comprising the capacitor $C_8$ is connected between the base of the transistor $T_{24}$ and the resonance circuit. The frequency divided signal $F_{out}$ is fed via the capacitor $C_3$ to the second input of the multiplier 8, thereby providing the signal $F'_{out}$.

A direct current (d.c.) biasing means in the form of a resistor $R_6$ is provided for biasing the collector of the transistor $T_{23}$. The biasing means may alternatively be in the form of a choke.

The resonance circuit comprises the inductor $L_1$, the capacitor $C_4$ and the resistor $R_1$ as described earlier. As can be seen from FIG. 3, the resonance circuit connects a point between the capacitors $C_2$ and $C_8$ to ground, which may be virtual ground.

The resonance circuit and the capacitors $C_2$ and $C_8$ when incorporated into an injection-locked divider (ILD) as described above affords advantages in that the ILD has an improved injection-lock range, a more symmetric injection range, and component values are more easily manufactured, particularly in integrated circuit form.

When a divider arrangement according to the present invention is implemented, it may be necessary to interface the injection-locked divider 2 to the frequency divider 3 by a means in the form of an interface circuit (not shown) for providing correct direct current levels and output swing. A similar circuit may be required to interface the frequency divider 3 and the FM detector 1. The construction of such interface circuits is a technique known to skilled men in the art of FM receivers.

I claim:

1. A frequency dividing arrangement comprising an injection-locked divider arranged for receiving an incoming signal and for providing a frequency divided signal in response thereto, and a frequency divider coupled to the injection-locked divider, which frequency divider comprises logical circuits for providing a further frequency divided signal in response to the frequency divided signal provided by the injection-locked divider;

wherein the injection-locked divider comprises a non-linear amplifying means, and a tuning circuit comprising a direct current blocking means, an alternating current coupling means and a resonance circuit, wherein the non-linear amplifying means is arranged to provide the frequency divided signal, via the direct current blocking means, in dependence upon the incoming signal and the frequency divided signal fed to a second input of the non-linear amplifying means via the direct current blocking means and the alternating current coupling means, and the resonance circuit couples a point between the direct current blocking means and the alternating current coupling means to ground.

2. A frequency dividing arrangement according to claim 1, wherein the direct current blocking means and the alternating current coupling means each comprise capacitors.

3. A frequency dividing arrangement according to claim 1, wherein the resonance circuit comprises an inductor connected in series with a capacitance.

4. A frequency dividing arrangement according claim 1, wherein said point is coupled to the virtual ground via a resonance means.

5. A frequency dividing arrangement according to claim 1, wherein the frequency divider is operative to frequency divide the signal provided by the injection-locked divider by two.

6. A frequency dividing arrangement according to claim 1, wherein the frequency divider is in the form of a D-type bistable.

7. A frequency modulation (FM) receiver for receiving an RF radio signal and for producing a signal indicative of the information content of the modulation wave of the radio signal, the FM receiver comprising:

a first injection-locked frequency divider having an input, a frequency division means, a control means for the frequency division means, and an output, said input being arranged to receive an RF radio signal and apply it to said control means whereby said frequency division means produces a frequency divided version of the RF control signal which is available at said output;

a second frequency divider coupled to the output of the injection-locked frequency divider to further divide the frequency-divided version of the RF radio signal;

and an FM detector coupled to the second frequency divider for receiving the further divided RF radio signal and providing an output signal corresponding to the modulation carried by the incoming signal.

8. A frequency modulation receiver according to claim 7, wherein the FM detector comprises a phase sensitive detector arranged to receive the further frequency divided signal from a first path and a second path, which second path has a phase shift means located therein, wherein the phase shift mean is operative to shift the phase of the further frequency divided signal from the second path relative to the further frequency divided signal from the first path in dependence upon its frequency so as to enable the phase sensitive detector to provide an output signal corresponding to the modulation carried by the incoming signal.

* * * * *